US010032732B1

(12) United States Patent
DiMarino et al.

(10) Patent No.: US 10,032,732 B1
(45) Date of Patent: Jul. 24, 2018

(54) SEMICONDUCTOR MODULE ARRANGEMENT

(71) Applicant: Virginia Tech Intellectual Properties, Inc., Blacksburg, VA (US)

(72) Inventors: Christina DiMarino, Blacksburg, VA (US); Dushan Boroyevich, Blacksburg, VA (US); Rolando Burgos, Blacksburg, VA (US); Mark Johnson, Nottingham (GB)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 0 days.

(21) Appl. No.: 15/585,545

(22) Filed: May 3, 2017

(51) Int. Cl.
*H01L 23/66* (2006.01)
*H01L 23/48* (2006.01)
*H01L 25/065* (2006.01)
*H05K 3/46* (2006.01)
*H05K 1/16* (2006.01)

(52) U.S. Cl.
CPC ............ *H01L 23/66* (2013.01); *H01L 23/481* (2013.01); *H01L 25/0652* (2013.01); *H01L 25/0657* (2013.01); *H05K 1/167* (2013.01); *H05K 3/4614* (2013.01); *H01L 2224/1134* (2013.01)

(58) Field of Classification Search
CPC ... H01L 23/66; H01L 23/481; H01L 25/0657; H01L 25/0652; H01L 2224/1134; H05K 3/4614; H05K 1/167
See application file for complete search history.

(56) References Cited

U.S. PATENT DOCUMENTS 8,829,692 B2 *  9/2014  Rajashekara ........... H01L 24/49
                                                    257/698
2013/0043593 A1  2/2013  Domes

* cited by examiner

*Primary Examiner* — David Vu
(74) *Attorney, Agent, or Firm* — W&C, IP (57) ABSTRACT

In a switching module structure that includes a low-impedance path to ground, such as a parasitic capacitance of an insulating substrate, a further insulating substrate presenting a parasitic capacitance placed in series with the low impedance current path and a connection of a conductive layer to input voltage rails using a single decoupling capacitor or, preferably, a midpoint of the voltage rails formed by a series connection of decoupling capacitors maintains a large portion of common mode (CM) currents which are due to high dV/dt slew rates of SiC and GaN transistors within the switching module.

15 Claims, 10 Drawing Sheets

SEMICONDUCTOR MODULE ARRANGEMENT

FIELD OF THE INVENTION

The present invention generally relates to switching power supply and regulation modules and, more particularly, to reducing common mode (CM) switching noise.

BACKGROUND OF THE INVENTION

Although alternating current provides important economies for transmission and distribution of power over significant distances and developing desired voltages proximate to the location where power is to be consumed, direct current (DC) at a desired, substantially constant and often closely regulated voltage is required by most electronic devices other than motors and illumination arrangements. While so-called analog regulators having a variable resistance in the series current path have been used in the past, switching power supplies and regulators avoid most of the power consumption involved in obtaining a desired voltage from an AC or unregulated DC source and many switching power supply and regulator topologies have been developed or are foreseeable. The reduction in power consumption is due to the fact that very little power is dissipated by the switches in their conductive or non-conductive states but only during the very brief periods during transitions between those states which are desirably as short as possible. On the other hand, for a given transition duration of the switches, the component of power consumption referred to as switching losses increases with switching frequency and imposes a trade-off between, for example, power consumption and load transient response time; favoring very short switching state transition times.

So-called wide bandgap switching devices have recently become available commercially which provide substantially improved switching performance over silicon transistor technologies. Specifically, increased electron saturation velocity, electron mobility, critical electric field for breakdown, bandgap energy and thermal conductivity are all achieved to some degree and in some cases by a substantial factor in gallium nitride (GaN) and silicon carbide (SiC) transistor technologies which lead to increased switching frequency, low on-state losses, high voltage capability and high temperature operation. In particular, switching devices made from these materials may exhibit switching transition times (e.g. dV/dt or slew rate during switching state transitions) several orders of magnitude larger than silicon switching devices. However, as a practical matter, the actual performance of wide bandgap semiconductor switches in power supplies and modules is often limited by the packaging and construction of the power module itself and the greatly increased electrical performance may substantially exacerbate problems normally associated with switching power converters.

Specifically, the high slew rate, dV/dt, exhibited by SiC and GaN devices can cause significant increases in electromagnetic interference (EMI) noise and common mode (CM) noise currents (I=C(dV/dt)) in parasitic capacitances (e.g. to a heat sink which is typically grounded for safety) in particular, especially at high frequencies which are difficult to filter. In fact, peak-to-peak noise currents can be comparable to the inductor current in the power module which can be conducted through electrical circuits and/or radiated as electrical fields that can induce voltages and/or currents in other circuits such as control and logic-level circuits with unpredictable results. While a combination of filtering and shielding of the entire power module is often used to reduce the lower CM EMI currents resulting from silicon switches to sufficiently low levels, such expedients are not adequate for the higher CM EMI currents resulting from SiC and GaN switches.

SUMMARY OF THE INVENTION

It is therefore an object of the present invention to provide an arrangement for containing the predominant portion of CM EMI noise within a power module in a manner consistent with adequate heat dissipation and limitation of electrical fields.

In order to accomplish these and other objects of the invention, a switching module is provided including a insulating substrate, at least two electronic switches mounted on said insulating substrate and connected to respective input voltage power rails, a further insulating substrate, a conductive layer between said insulating substrate and said further insulating substrate, and a connection arrangement for diverting current capacitively coupled to said conductive layer to a respective input voltage power rail.

In accordance with another aspect of the invention, a method of circulating and maintaining a substantial portion of common mode current within a switching module including a low impedance, high frequency current path to ground is provided comprising steps of increasing impedance of said low impedance, high frequency path to ground by connecting a structure exhibiting a parasitic capacitance in series therewith and directly or indirectly connecting a node between said low-impedance, high frequency path to ground and said structure exhibiting a parasitic capacitance to an input voltage DC bus rail of said switching module.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
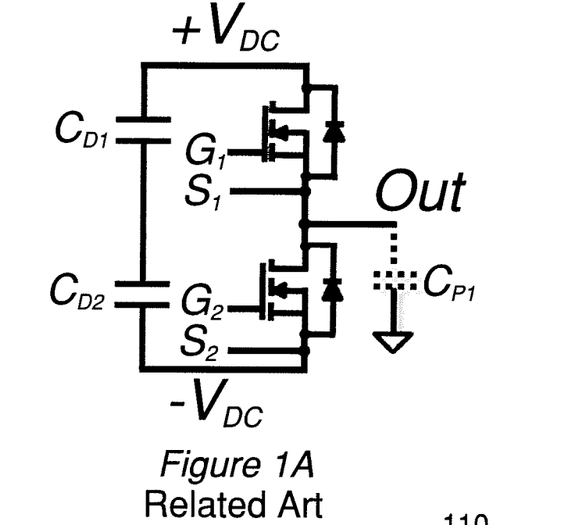
FIGS. 1A, 1B and 1C are a schematic diagram and oblique and cross-sectional view of a power module useful for understanding the problems addressed by the invention.
Figure 1B:
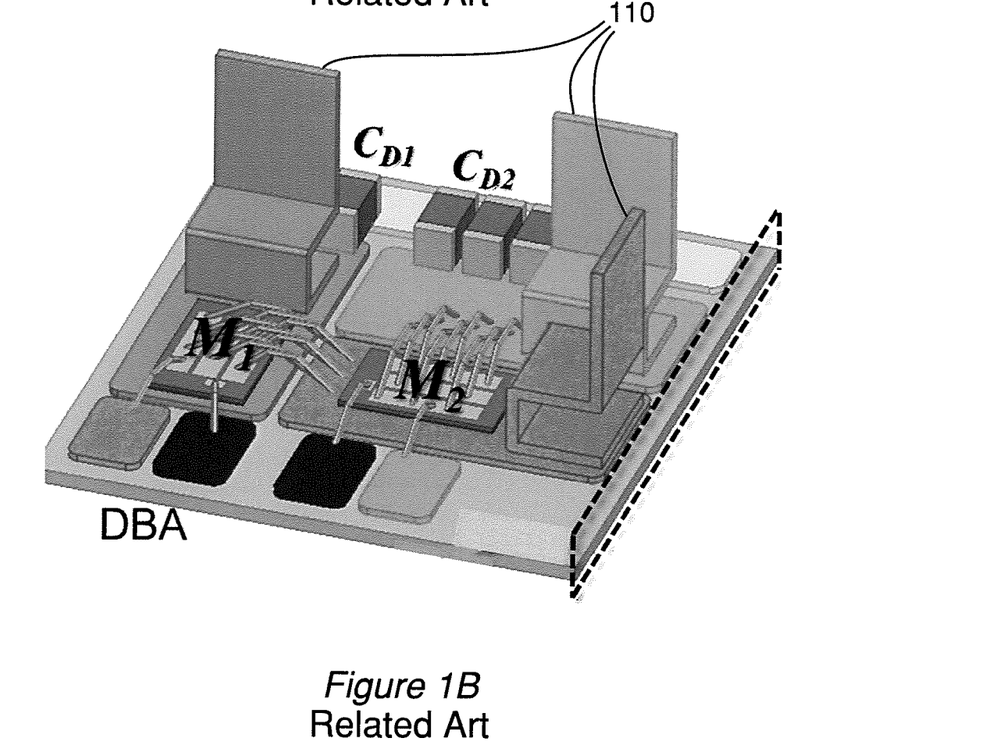
Figure 1C:
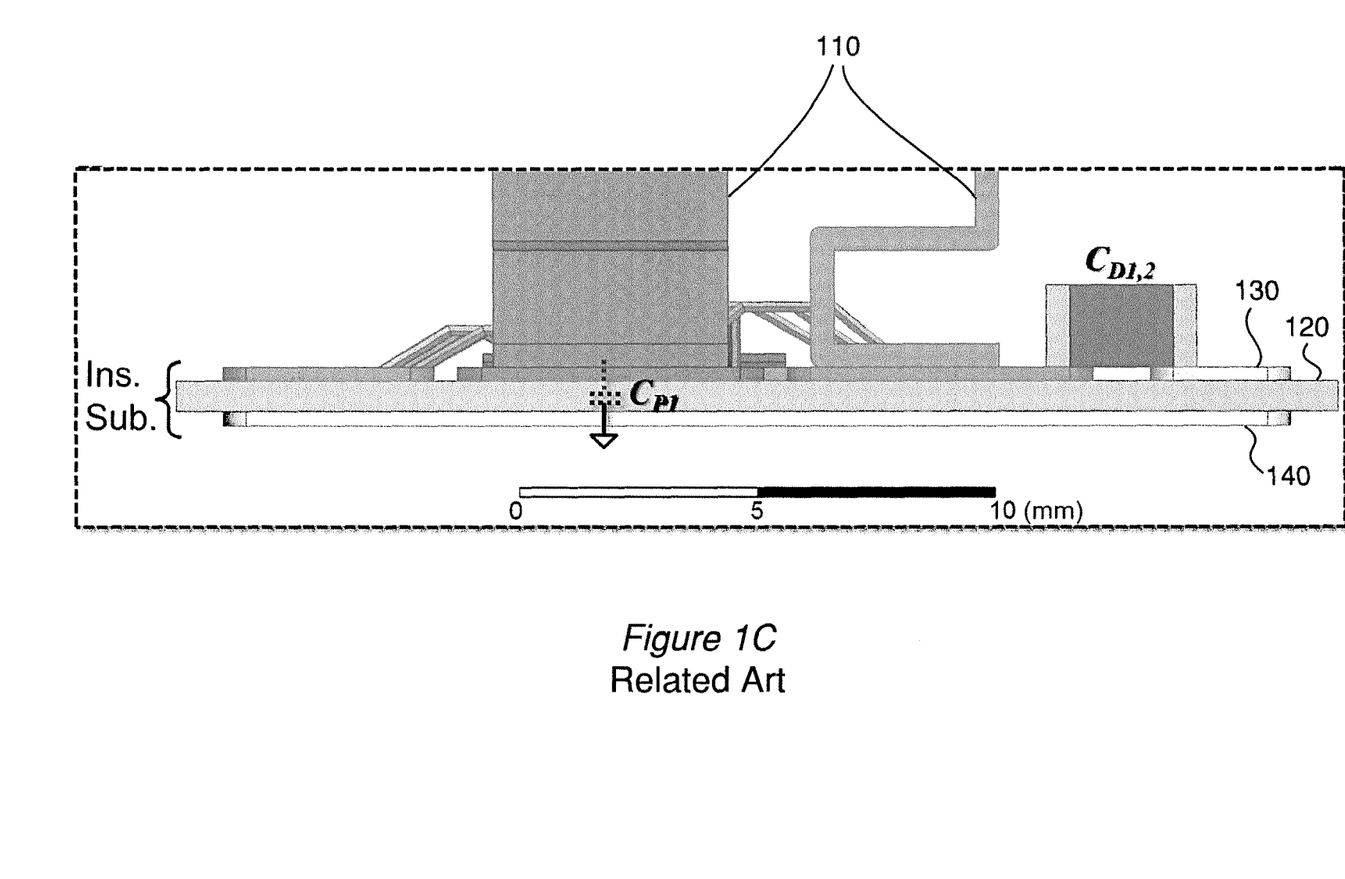

Referring now to the drawings, and more particularly to FIGS. 1A-1C, there is shown a schematic diagram and oblique and cross-sectional views of a power module useful for understanding the problems addressed by the invention.

Since these Figures are arranged to facilitate an understanding of the invention by comparison with other Figures and the invention is not included, no portion of FIGS. 1A-1C is admitted to be prior art in regard to the invention and are thus labeled "Related Art".

A simplified schematic diagram of a half-bridge switching module is shown in FIG. 1A and an oblique view of a practical construction therefor is shown in FIG. 1B. It should be understood that a half-bridge configuration is merely exemplary of numerous different switching arrangements that can be used in power supplies of many different topologies and functionalities, power factor correction circuits, inverters and the like with inclusion of additional components such as an inductor. Similarly, the construction and component layout shown in FIG. 1B is suitable for power modules capable of delivering output power of at least 1 kW but similar constructions and component layouts are suitable for larger or smaller output power capacities. Basically, the switching module comprises two semiconductor switches, M1 and M2, connected in series between two sources of input voltage (e.g. +V and −V) which are operated in a generally complementary fashion with the output taken at the node connecting them. Decoupling capacitors, $C_{D1}$ and $C_{D2}$, which are desirable in high speed switching modules because, when placed near the semiconductor switches they form a low-impedance, high frequency commutation loop that tends to suppress overshoot and/or undershoot and ringing caused by stray inductances within the module package as well as the DC bus bars. Due to this low-impedance, high frequency loop, decoupling capacitors improve the effectiveness of the invention, as will be described below.

These components and connection tabs 110 for connection of the input power and the output connection are mounted on an insulating substrate, preferably having a ceramic layer with a metallization layer (e.g. usually of copper or aluminum or an alloy directly bonded or brazed onto the ceramic, often referred to as direct bonded copper (DBC), direct bonded aluminum (DBA), active metal brazed (AMB) or the like) on both sides for providing both structural support and thermal conduction on the bottom side and electrical connections of the switches, capacitors, connection tabs and other electrical components that may be included, with or without use of additional wire bonds on the other or upper side which may be patterned in the manner of a printed circuit board. The insulating substrate (typically made of ceramic due to its good thermal properties) electrically isolates the switching module from a heat sink, which is preferably grounded for safety reasons. However there is an unavoidable parasitic capacitance, $C_{P1}$, associated with this substrate structure. Since the output is alternately connected to each of the input power voltages and is carried by a conductor on or proximate to the insulating substrate, the parasitic capacitance becomes a path for CM current between the input power potentials to any underlying conductive structure such as a grounded heat sink. Since the current in this parasitic capacitance path is I=C(dV/dt) and the dV/dt transients can be very large using SiC and GaN switches, the current levels can be significant and sufficient to be coupled to other circuits where they can corrupt signals or even damage electronic elements with unpredictable results.

Figure 2A:
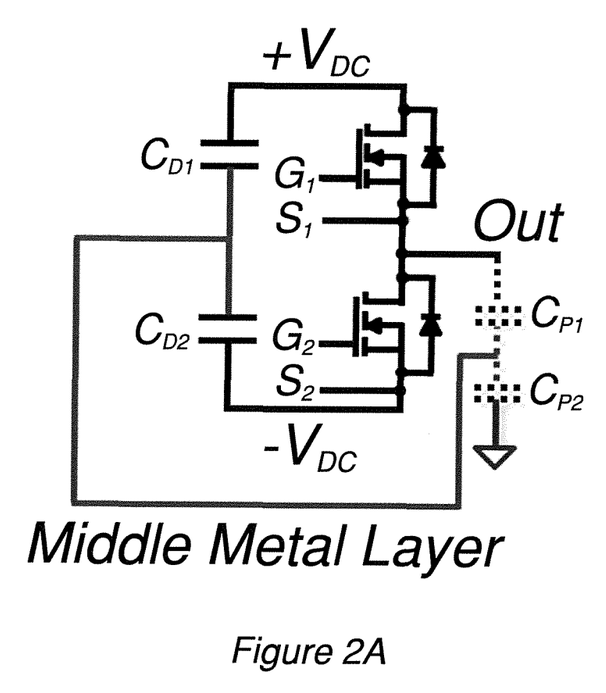
FIGS. 2A and 2B are a schematic diagram and a cross-sectional view of an embodiment of the invention useful for understanding the basic principles thereof.
Figure 2B:
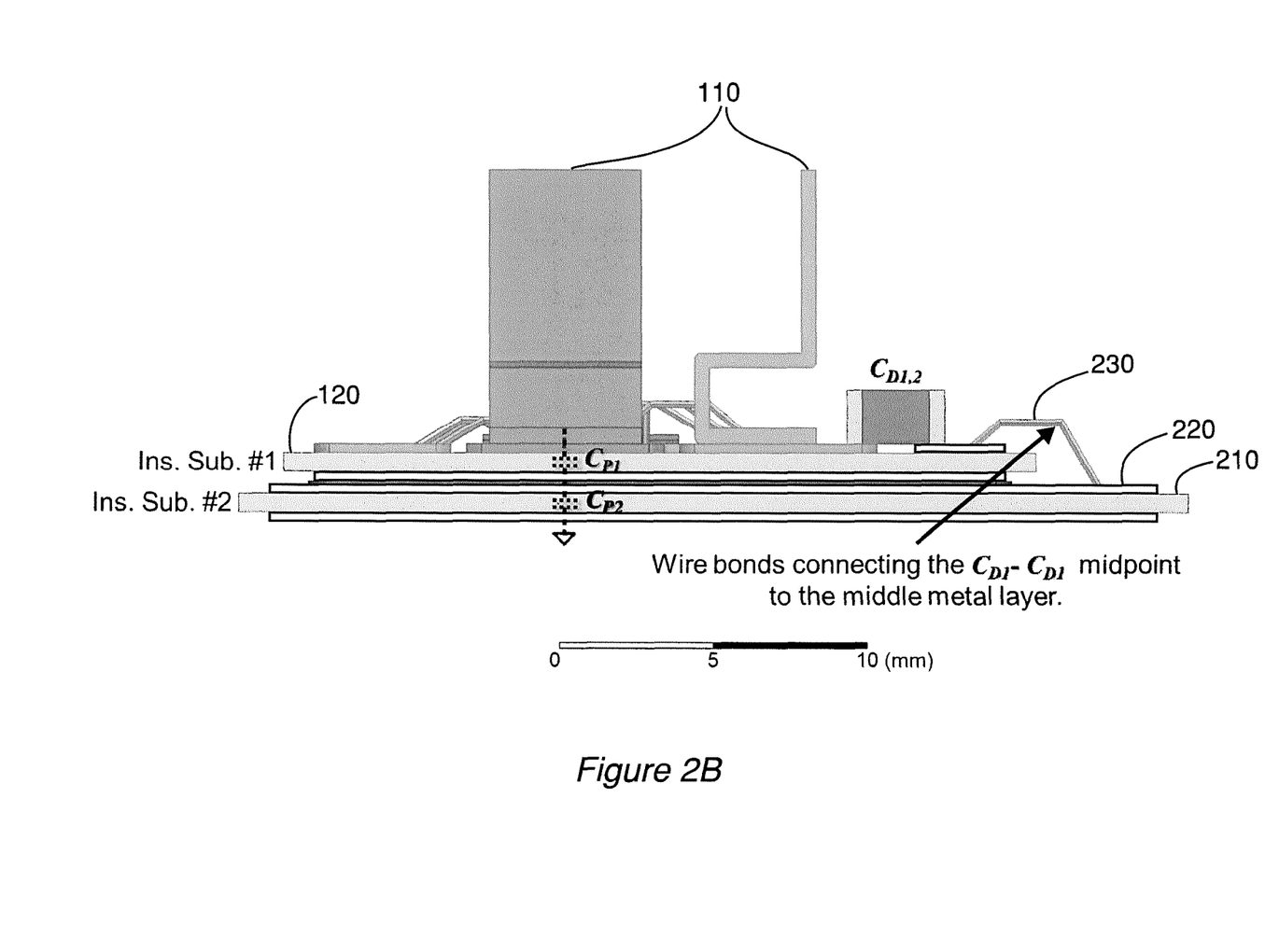

In sharp contrast to the use of a combination of filtering and external switching module shielding, as alluded to above for reducing CM noise in silicon-based switching modules, the invention seeks to maintain a large portion of the CM current within the switching module with an internal and embedded screen formed by placing a further insulating substrate 210 preferably having conductive layers on opposite sides thereof below the insulating substrate forming $C_{P1}$ to form an additional parasitic capacitance, $C_{P2}$, in series with $C_{P1}$ and connecting the node between them, formed by a conductive (e.g. metal) layer 220 or pair of conductive layers in contact with each other between the insulator layers as shown in FIG. 2B, and connected in such a way that a significant portion of the CM current is diverted and absorbed by one or both input power busses and/or the decoupling capacitors $C_{D1}$ and/or $C_{D2}$ such that a large portion of the CM current circulates and is maintained within the switching module. An exemplary and preferred connection is schematically shown in FIG. 2A.

The amount of the CM current that is diverted depends strongly on the high frequency impedance of the connection back to the DC bus. The series connection of parasitic capacitances necessarily increases the high frequency impedance of the CM current path to ground. Furthermore, in order to maximize the amount of CM current that is diverted $C_{P2}$ should be small enough such that its high frequency impedance is greater than that of the path to the DC bus and/or decoupling capacitors. The key point in maintaining the CM current within the switching module is to make the return path from the embedded screen formed by the metallization between the insulating layers between the parasitic capacitors to the positive and negative voltage rails much smaller than the external CM current path to ground. That is, while the further insulating substrate increases high frequency impedance to ground, the impedance from the screen to the input power rails is somewhat reduced by coupling to both power rails either from a node between the serially connected decoupling capacitors or by direct connection to the positive or negative input voltage rail with an indirect connection to the other input voltage rail through a single decoupling capacitor connected between the input voltage rails.

In the former, preferred connection arrangement, capacitor $C_{P2}$ can be made small by making the second dielectric layer relatively thick (e.g. providing greater separation between conductive layers forming the capacitance) and/or of relatively low dielectric constant. Further, the structure illustrated in FIG. 2B shows use of wire bonds 230 for making the connection between the common node of the parasitic capacitors and the decoupling capacitors. These wire bonds will also exhibit significant parasitic inductance which, if large, will increase the high frequency impedance in the wire bonds portion of the CM current path and reduce the amount of CM current that can be diverted.

Figure 3A:
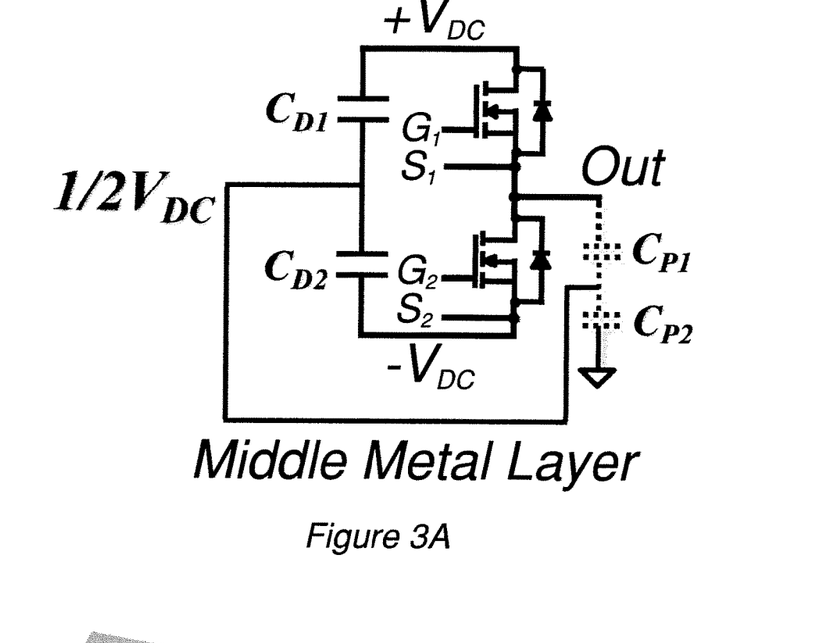
FIGS. 3A, 3B and 3C are a schematic diagram, oblique view and a cross-sectional view of a preferred embodiment of the invention.
Figure 3B:
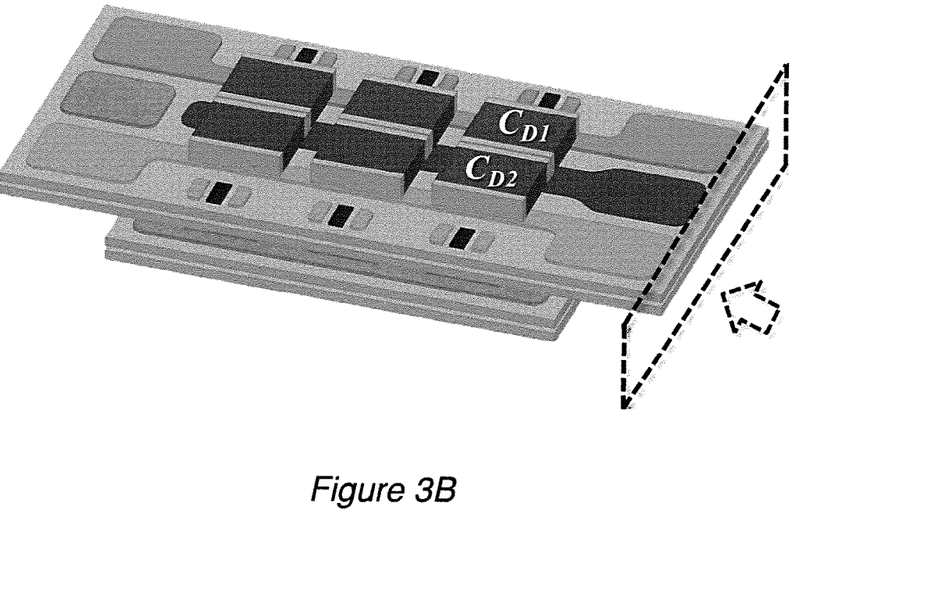
Figure 3C:
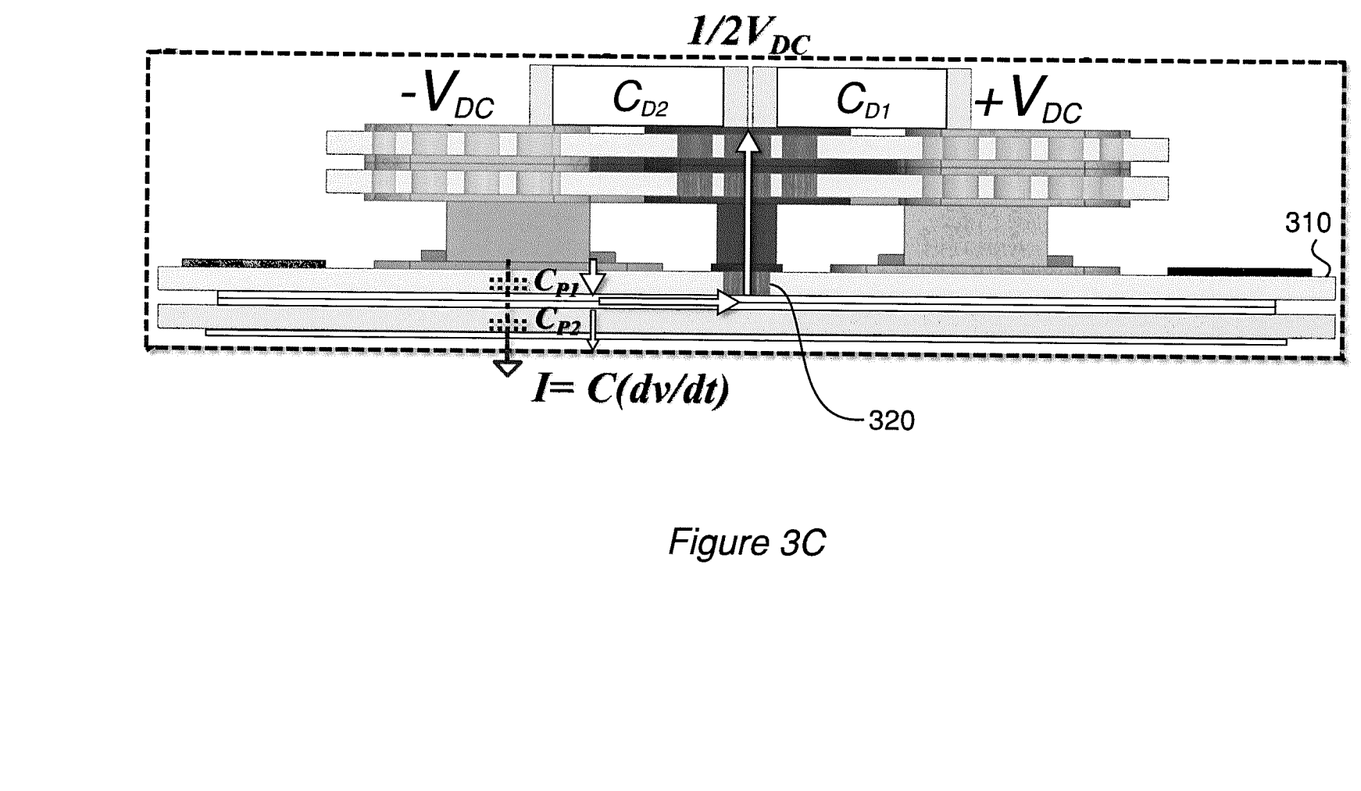

This latter potential problem can be solved as illustrated in FIG. 3A-3C. Several substrate manufacturers now offer insulating substrates in which through-hole perforations or vias are formed in the insulating layer (e.g. ceramic) which can be used as the upper insulating substrate 310 by filling a via in an appropriate location for connection to the common node of the series connection of decoupling capacitors, $C_{D1}$ and $C_{D2}$, as depicted at 320 of FIG. 3C. This connection can thus be very short and relatively broad to minimize inductance and resistance of the connection that conducts the CM noise current. It should also be noted that the layout of this embodiment, best seen in FIG. 3B is different from that of FIG. 2B and provides for symmetrical placement of switches and decoupling capacitors and parallel paths for the positive and negative power busses and the connection to a node of the serial connection of decoupling capacitors. This layout serves to minimize connection lengths, particularly when including a via connection, to minimize inductance and impedance of the diverted CM current. Use of vias rather than wire bond also allows reduction in size of the module since no area is required for the wire bond to be made and the via can be and, desirably, is within the footprint of the common node of the decoupling capacitors. Techniques for forming mechanically robust and low resistance via connections is a mature technology well-known in the art.

As alluded to above, it is preferred to connect the conductive layer between the insulating substrates to the midpoint between the decoupling capacitors. It should be understood, however, that the invention would be operative with the conductive layer between the insulating substrates connected to either the positive or negative input voltage power bus. However, if such a connection is directly made to only one of the power rails (which are readily accessible) rather than to the midpoint of the rail voltage through decoupling capacitors, substantial electric field concentration occurs as shown in the 2D ANSYS Maxwell electric field plot of FIG. 4A which can cause partial discharge that could result in insulation failure. In comparison, if the conductive layer between the insulating substrates is connected to the midpoint of the series decoupling capacitors, then the electric field is significantly reduced, as shown in FIG. 4B. It is clear from a comparison of these Figures that it is advantageous to connect the conductive layer between the insulating substrates to the midpoint of the DC bus as opposed to the positive or negative bus potentials since the peak electric field is drastically reduced. In fact, the electric field for embodiments where the conductive layer between the insulated substrates is connected only to the either the positive or negative DC bus potentials is the same as or even slightly worse than the switching module with only one insulating substrate (e.g. in the absence of the invention). In other words, if the conductive layer between the insulating substrates is connected to either of the positive or negative DC bus potentials rather than the midpoint of the rail voltages, then the additional insulating substrate is not being effectively utilized.

Figure 4A:
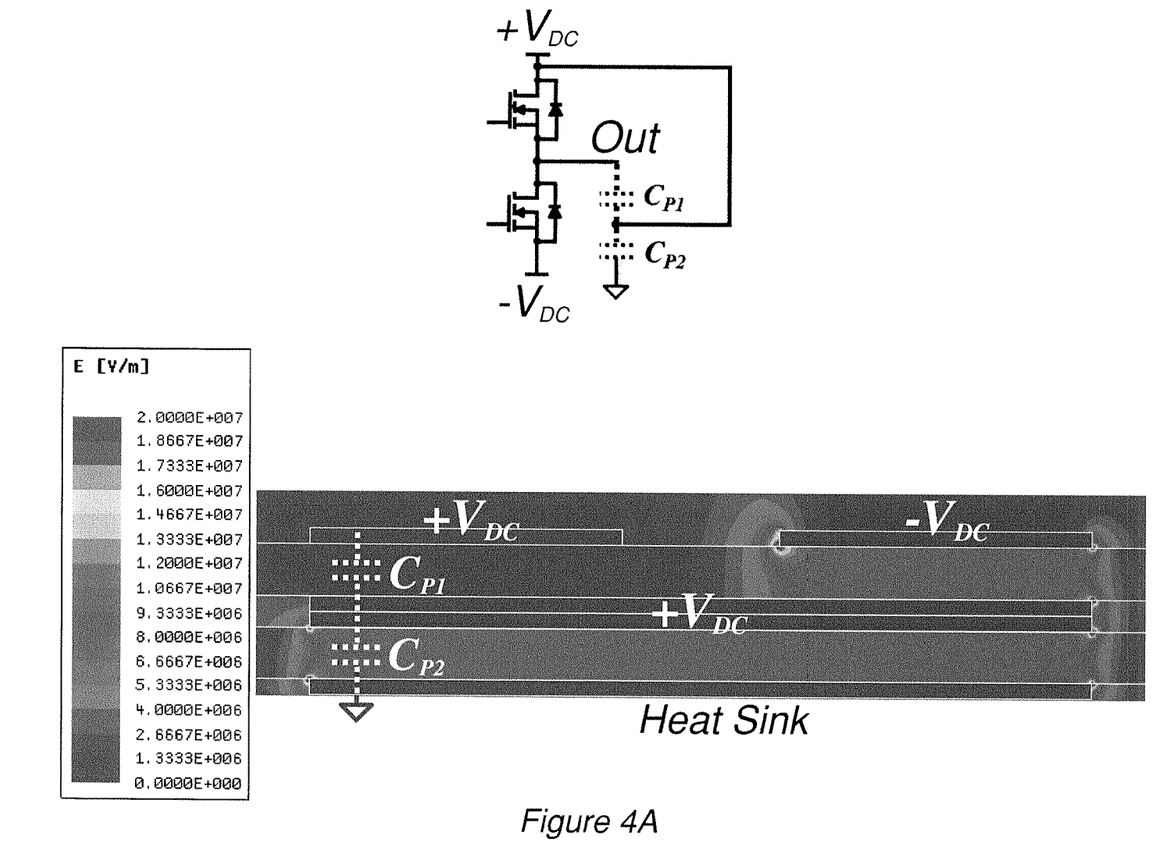
FIGS. 4A and 4B are schematics and corresponding 2D ANSYS Maxwell field plots when the conductive layer between the insulating substrates is directly and indirectly connected to different DC bus voltage rails, respectively.
Figure 4B:
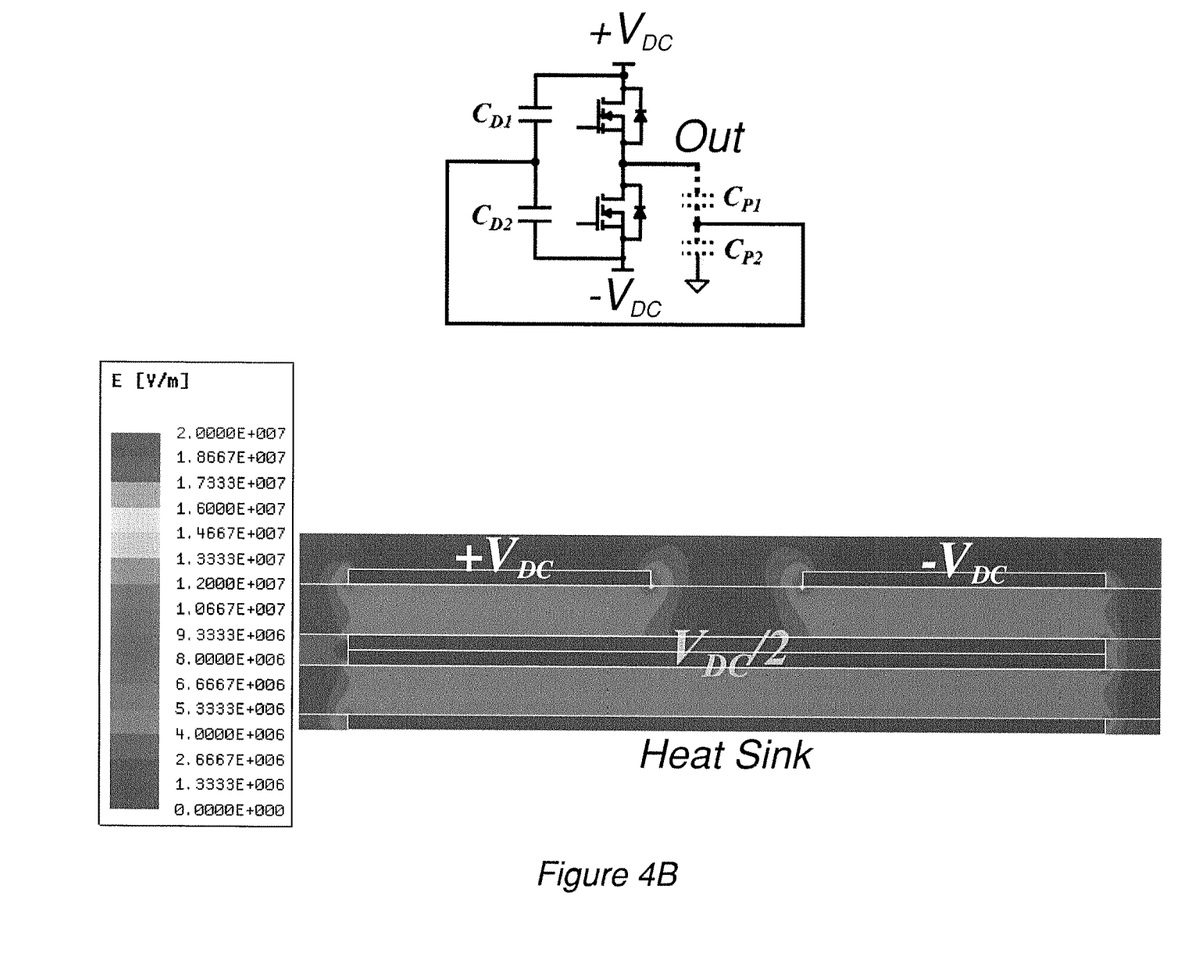

In this regard, it should also be appreciated from FIG. 4A that the field strength can reach unacceptably high levels, particularly with commercially available ceramic insulating substrates. That is, in many applications, it is highly desirable to reduce the size and increase the voltage levels of power electronic modules which results in increased electric field concentration within the module. Since the insulating substrate provides electrical isolation, high electric field concentration can occur within the insulating (e.g. ceramic) layer. While breakdown in the dielectric material itself is typically not a limiting factor, the electrical field in some insulating structures will be concentrated at so-called triple points where an interface between three materials of different permittivity occur. In the case of commercially available insulating substrates, triple points occur at the interface of the insulating layer, the conducting layer, and an encapsulating layer. If the peak electric field at such a triple point surpasses the dielectric strength of either the insulating layer or the encapsulating layer, partial discharge can occur. Repetitive partial discharges can eventually lead to failure of the dielectric material(s) and destroy the module. Accordingly, for reduction in size and/or increase of voltage in power modules, care must be taken to reduce the peak electric field at any triple point that may be present, such as by rounding of corners of shaped conductors or insulating layers. In the case of the present invention, the second insulating substrate is very effective to limit high electrical fields since the middle conductive layer is connected to one-half the rail voltage by the capacitive voltage divider formed by the series connection of the decoupling capacitors, which reduces the electric fields both within the insulating layers and at the triple points. This reduction in electric field strength does not occur when the middle conductive layer between the insulating substrates is connected to the positive or negative voltage rail.

It should be appreciated that the above-described embodiments of the invention are highly counter-intuitive, especially for high power switching circuits and power modules. As is generally known, insulating materials are inherently poor thermal conductors, particularly in comparison with electrically conductive materials. In addition, the formation of an additional, series-connected parasitic capacitance substantially increases the thickness of the composite substrate layers (particularly if the additional capacitance is kept small by increased thickness of dielectric) and increases the number of boundaries of differing materials; any or all of which tend to increase thermal resistance and would be expected to increase the switching module operating temperature. However, comparative thermal simulations have shown that, in most cases, the switching module with two stacked substrates in accordance with the invention exhibits lower peak temperatures than a switching module having only a single substrate. Without wishing to be held to any particular theory resulting in reduced peak operating temperatures produced by the embodiments of the invention as discussed above, it appears that such an effect is due to the increased heat spreading in the conductive layer between the two insulating layers. Thus, the additional insulating substrate tends to operate at a more uniform temperature which increases efficiency of heat transfer over a larger area and thereby reduces the need for a baseplate (e.g. between the insulating substrate(s) and a heat sink) to perform a heat spreading function.

Figure 5A:
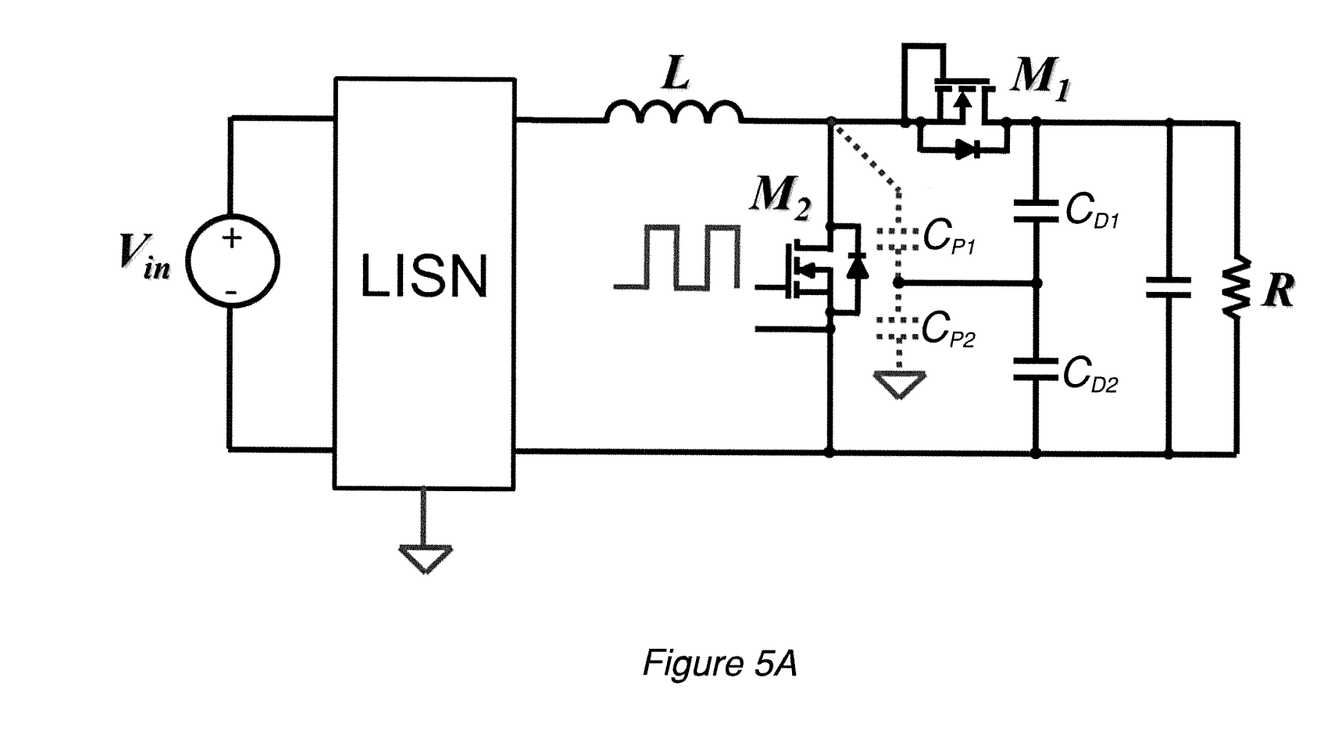
FIGS. 5A and 5B are, respectively, a schematic for a simulated boost converter employing the invention and a comparison of CM noise current without the invention and the invention with two different exemplary values of decoupling capacitors.

To validate the operability and potential effectiveness of the invention to reduce CM EMI noise and to maintain CM currents within the switching module, a boost converter was assembled using SiC MOSFETs for switches M1 and M2 as schematically shown in FIG. 5A. This boost converter was then tested using different values of decoupling capacitors $C_{D1}$ and $C_{D2}$ and in an embodiment omitting the decoupling capacitors and second/lower parasitic capacitor $C_{P2}$ as schematically illustrated in the Related Art FIG. 1 for comparison.

It should be understood in regard to this experimental evaluation that while the boost converter was designed to deliver high power levels and the SiC switches were rated at 1.2 kV, for reasons of convenience and economy, the DC bus voltage was limited to essentially proof-of-concept conditions of less than 50 volts and thus does not reflect results that could be obtained under full potential operational conditions. This very substantial reduction in voltage was based on the fact that the module was not encapsulated (consistent with the ability to substitute different values of decoupling capacitors) to provide electrical isolation as would normally be the case. Also, for simplicity and economy, no cooling system was provided and the lower DC bus voltage was chosen to minimize heat dissipation in the MOSFET die. However, this low DC bus voltage also effectively reduces the dV/dt of the SiC switches to about 8 V/ns at turn-on and 1.6 V/ns at turn-off which are values not significantly higher than would be expected for conventional silicon switches. Therefore, much less CM noise is generated than would be expected under normal operational conditions at high DC bus voltage. Further, since the module built for these experiments was small, the parasitic capacitance to ground was very much reduced in comparison with a switching module to be operated near full potential capacity thereby also reducing the amount of CM noise current produced. Additionally, as a practical matter of constructing the switching module used in these experiments, wire bonds were used for connections which, as alluded to above, exhibit non-negligible inductance, hence further limiting the amount of CM current that can be diverted. Finally, the EMI spectrum illustrated in FIG. 5B included both CM and differential mode (DM) noise which tends to reduce the amount of improvement in CM noise reduction apparent from the experimental results since the DM noise included in the experimental results is substantially unaffected by the invention.

Figure 5B:
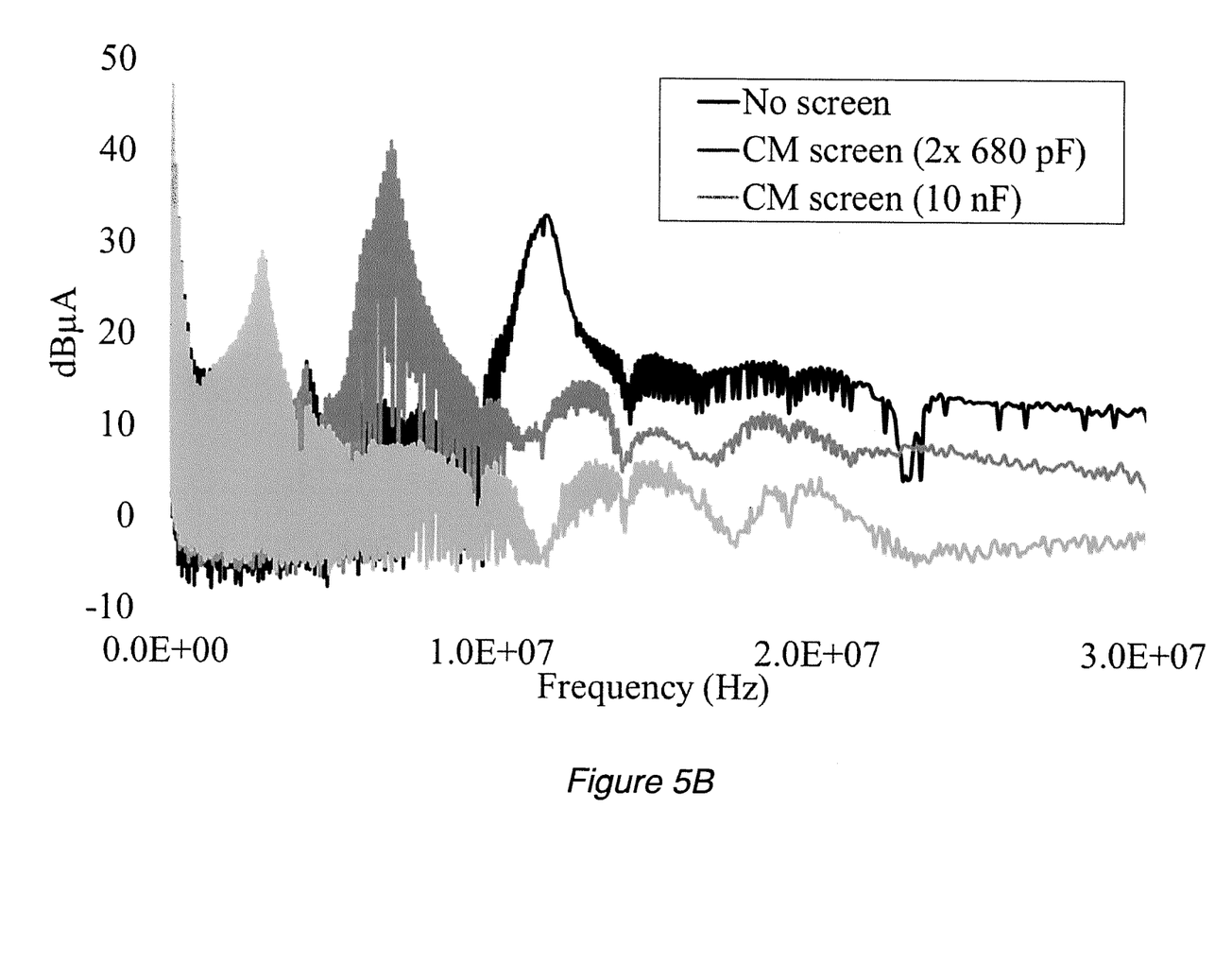

The EMI spectra using decoupling capacitances of 10 nF and 2×680 pF (a parallel connection of two 680 pF capacitors for each of the decoupling capacitors) and without decoupling capacitances are shown in FIG. 5B. While the invention has little effect at very low frequencies and the proof-of-concept experimental conditions tend to reduce the apparent effectiveness of the invention, it can nevertheless be observed that the invention reduces the amplitude of the EMI noise spectrum at high frequencies by more than 15 dB or about 50% using 10 nF decoupling capacitors. It can also be observed that the decoupling capacitors reduce the frequency of the resonant peak. These effects are increased for larger values of the decoupling capacitors but which can still be of much lower values than the value of the filter capacitor and of sufficiently small physical size to be embedded in a switching module. It should also be appreciated that the approximate values of $C_{P1}$ and $C_{P2}$ at 20 MHZ, as determined by simulation are 20 pF and 240 pF, respectively. Accordingly, these experiments clearly demonstrate that a substantial fraction of the CM current (which is increased when SiC or GaN switches are used compared to silicon switches) can be made to circulate within a switching module rather than being allowed to be coupled to structures or circuits external to the switching module. Further these proof-of-concept experiments also indicate that the invention may also be effective to retain CM currents in switching modules using conventional silicon switches where some physical or electrical structure presents a low impedance path to ground for CM current.

In view of the foregoing, it is clearly seen that the invention as described in detail above provides a solution to the generation of increased CM currents due to the increased voltage and switching speeds available from SiC and GaN switching devices by causing a substantial fraction of the CM current to be diverted from an embedded screen and circulated and maintained within the switching module through a return path to both voltage rails consistent with small size, high power density and improved thermal performance of a switching module using one or more small capacitors which can also be embedded within the power switching module. The principles and structure that achieves such meritorious effects is simple and can be formed with parts and materials which are commercially available and is applicable to power converters, power factor correction (PFC) circuits, inverters and the like of any capacity or design. Further, while the invention is directed to a problem caused by the electrical properties of SiC and GaN switches, the principles and structures of the invention can be applied with similar effects in switching module having switches of any known or foreseeable semiconductor technology including but not limited to silicon and germanium.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A semiconductor module arrangement including
   a insulating substrate,
   at least two electronic switches mounted on said insulating substrate and connected to respective input voltage power rails,
   a further insulating substrate,
   a conductive layer between said insulating substrate and said further insulating substrate forming a capacitance across said insulating substrate,
   a further capacitance across said further insulating substrate and in series with said capacitance across said insulating substrate said further capacitance being smaller than said capacitance across said insulating substrate, and
   a connection arrangement for diverting current capacitively coupled to said conductive layer to at least one of said input voltage power rails through at least one decoupling capacitor.

2. The semiconductor module arrangement as recited in claim 1, wherein said at least two electronic switches are formed of silicon carbide.

3. The semiconductor module arrangement as recited in claim 1, wherein said at least two electronic switches are formed of gallium nitride.

4. The semiconductor module arrangement as recited in claim 1, further including a low-impedance commutation loop.

5. The semiconductor module arrangement as recited in claim 1, further includes two serially connected decoupling capacitors connected in parallel with said two electronic switches.

6. The semiconductor module arrangement as recited in claim 5, wherein said connection arrangement connects said conductive layer to a node between said decoupling capacitors.

7. The semiconductor module arrangement as recited in claim 6, wherein said connection arrangement includes a connection made through a via in said insulating substrate.

8. The semiconductor module arrangement as recited in claim 1, wherein said connection arrangement includes a connection made through a via in said insulating substrate.

9. The semiconductor module arrangement as recited in claim 1, wherein a parasitic capacitance value of said further insulating substrate is less than a parasitic capacitance value of said insulating substrate.

10. The semiconductor module arrangement as recited in claim 1, wherein a thickness of an insulating layer of said further insulating substrate is greater than an insulating layer of said insulating substrate.

11. The semiconductor module arrangement as recited in claim 1, wherein a dielectric constant of said further insulating substrate is less than a dielectric constant of said insulating substrate.

12. The semiconductor module arrangement as recited in claim 1, wherein at least one of said insulating substrate and said further insulating substrate includes an insulating layer of ceramic material.

13. The semiconductor module arrangement as recited in claim 1, further including
   a heat sink thermally coupled to said further insulating substrate.

14. The semiconductor module arrangement as recited in claim 1, wherein said switching module includes an inductor to cause said switching module to function as a power supply module.

15. The semiconductor module arrangement as recited in claim 14, wherein said power module function is that of a boost converter.

* * * * *